United States Patent [19]

Goldman

[11] 4,339,528
[45] Jul. 13, 1982

[54] ETCHING METHOD USING A HARDENED PVA STENCIL

[75] Inventor: Abraham Goldman, Kendall Park, N.J.

[73] Assignee: RCA Corporation, New York, N.Y.

[21] Appl. No.: 265,108

[22] Filed: May 19, 1981

[51] Int. Cl.³ .......................... C23F 1/02; G03C 5/00
[52] U.S. Cl. .................................... 430/323; 430/28; 430/289; 430/318; 430/329; 156/659.1; 156/904
[58] Field of Search ............ 156/654, 655, 656, 659.1, 156/668, 904, 667; 430/29, 323, 329, 330, 274, 289; 134/2, 40; 427/282

[56] References Cited

U.S. PATENT DOCUMENTS 3,415,648 12/1968 Certa ........................................ 96/36
3,589,907 6/1971 Dijkstra .................................. 96/93
4,061,529 12/1977 Goldman ............................. 156/644
4,208,242 6/1980 Zampiello ......................... 156/659.1

Primary Examiner—Edward C. Kimlin
Assistant Examiner—F. K. Wine
Attorney, Agent, or Firm—E. M. Whitacre; D. H. Irlbeck; L. Greenspan

[57] ABSTRACT

The method comprises producing on the surface to be etched a stencil of a light-hardened PVA. The stencil is produced by light hardening selected portions of a film or coating consisting essentially of dichromate-sensitized PVA. The PVA is about 85% to 97% hydrolyzed and has a molecular weight of 75,000 to 100,000. After light hardening, the nonhardened portions of the film are removed, thereby producing the stencil. The stencil is baked to improve its etch resistance, the surface is etched through the stencil, and then the stencil is removed from the surface.

10 Claims, 5 Drawing Figures

ETCHING METHOD USING A HARDENED PVA STENCIL

BACKGROUND OF THE INVENTION

This invention relates to a novel method of etching a metal body and, particularly, to an etching method that includes producing on the surface of the body an etch-resistant stencil of light-hardened poly(vinyl alcohol-acetate). The stencil is easily removable with the aid of a dilute aqueous alkali solution after the etching step is completed. Poly(vinyl alcohol-acetate) is also designated herein as PVA.

The preparation of apertured masks by photoexposure and etching has been described previously, for example, in U.S. Pat. No. 4,061,529 issued Dec. 6, 1977 to A. Goldman et al. In a typical process, light-sensitive coatings of sensitized protein materials are applied to both major surfaces of a thin metal sheet, such as a sheet of a cold-rolled steel or of a copper-nickel alloy. The coatings are exposed to light images, as by contact-printing exposure, to harden (render less soluble) the exposed portions of the coatings in an aqueous solvent. The exposed coatings are developed by removing only the more-soluble portions of the coatings, thereby producing a stencil on each surface of the sheet. Then, the stencils are baked to make them more resistant to an etchant, usually an aqueous ferric chloride-hydrochloric acid solution. Then, the sheet with the stencils thereon is selectively etched as desired, after which the stencils are removed from the sheet.

In present commercial practice, the light-sensitive coatings are a dichromate-sensitized casein; such as the coatings disclosed in the above-cited Goldman et al. patent. Etch resistance is developed by baking the coatings in air at about 260° C. to 350° C. After etching with a ferric chloride-hydrochloric acid solution, the stencils are removed by applying thereto a hot aqueous solution of sodium hydroxide.

It is desirable to provide alternative light-sensitive coatings, particularly light-sensitized synthetic materials in place of the light-sensitized protein materials that are presently used. In addition, it is desirable to reduce the cost of materials and manufacture of the etched product. U.S. Pat. No. 4,208,242 issued June 17, 1980 to P. Zampiello suggests using films of dichromate-sensitized poly(vinyl alcohol-acetate) as the light-sensitive coating for making apertured masks in steel sheets. The PVA employed in this film is 98.5% to 100% hydrolyzed and has a molecular weight of about 14,000. The film, after developing, is baked at about 250° C. to 300° C. for about 2 to 3 minutes to improve the acid resistance thereof. This produces very adherent stencils which require a special treatment to remove them. That treatment requires, after etching the sheet, baking the stencils at about 250° C. to 300° C. until the stencils are carmelized. Then, the carmelized stencils can be removed with a hot aqueous sodium hydroxide solution.

SUMMARY OF THE INVENTION

The novel method follows the prior methods except in the following important respects. The novel method employs coatings of dichromate-sensitized PVA in which the PVA is about 87% to 97% hydrolyzed and has a molecular weight of about 75,000 to 100,000. As a result, the stencils can be baked in a lower temperature range of about 200° C. to 240° C. prior to etching in order to improve the acid resistance thereof. In addition, after the etching step, the stencils do not require baking or carmelizing or any other special treatment in order to remove the stencils effectively. Finally, more dilute aqueous solutions of alkali can be used to remove the stencils from the metal body.

DETAILED DESCRIPTION OF THE PREFERRED EMBODIMENT

Figure 1:
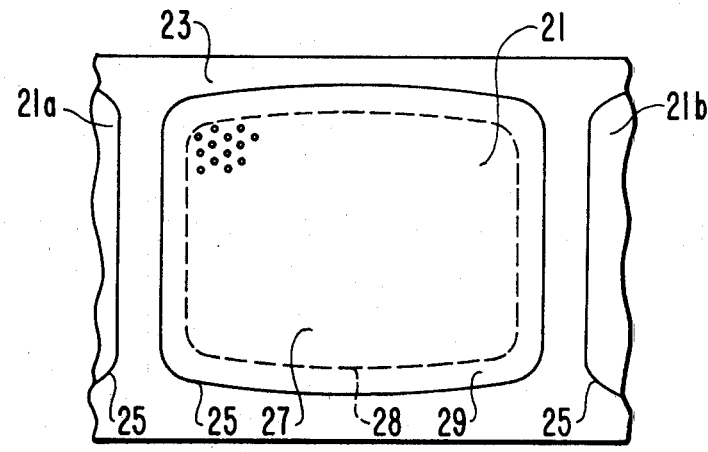
FIG. 1 is a plan view of a metal sheet after etching according to the novel method.

FIG. 1 shows a plan view of an etched apertured mask blank 21 as it emerges from an etching machine. The mask blank 21 (which is to be used in a color-television picture tube) is in a metal sheet 23 comprising a succession of such mask blanks 21a, 21 and 21b which are etched through at the margins 25 thereof except at convenient points (not indicated) sufficient to hold the mask blank 21 in place in the sheet 23. The mask blank 21 is comprised of an apertured central portion 27 defined by the broken line 28; and a skirt or peripheral portion 29 which is not apertured, although in some embodiments it may be etched partly through. This application is particularly concerned with the etch-resistant stencil used for etching the apertures in the apertured central portion 27. The apertures may be round and arranged in a hexagonal, diamond-shaped or other array. Or, the apertures may be rectangular slits arranged in vertical rows; for example, 6-mil by 30-mil slits on 30-mil centers. The apertures may be of other shapes and arrangements. In any of the embodiments, the aperture width may be uniform across the mask or may be graded in width or diameter from the center to the edge of the array as is known in the art.

The mask blank 21 is etched into a regular-carbon or a low-carbon cold-rolled-steel sheet about 4 to 10 mils in thickness. The etching also may be conducted in sheets of other materials, such as invar alloy, or copper-nickel alloy. The sheet 23 is passed through the various operations including cleaning the sheet, producing etch-resistant stencils on the sheet, etching the sheet to produce the apertures and to define the mask blanks, and then stripping the stencils from the sheet. Subsequently, the mask blanks 21 are separated from the sheet 23. The mask blanks 21 are then heat treated (annealed), roller leveled, formed on a press, and then blackened as is known in the art, to produce masks suitable for assembly into a color-television picture tube.

Figure 2:
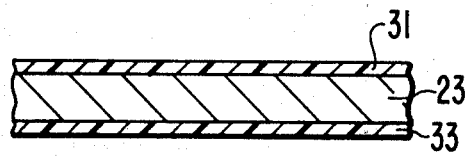
FIGS. 2 through 5 are sectional views through one aperture location of a metal sheet illustrating the steps of one embodiment of the novel method.
Figure 3:
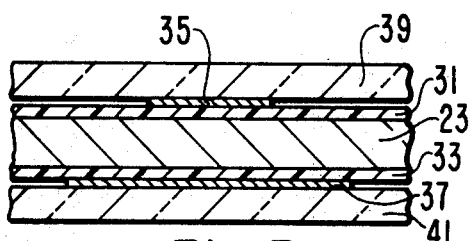

FIGS. 2 through 5 illustrate the novel method by a sequence of steps that may be used in making an aperture in the central portion 27 of a hexagonal array of apertures in a 6-mil-thick strip of low-carbon cold-rolled steel, as shown in FIG. 1. The sheet 23 is coated on both major surfaces with one of the liquid coating compositions set forth below. The coatings are dried in air, producing light-sensitive coatings 31 and 33 of dichromate-sensitized PVA, as shown in FIG. 2. After the coatings have dried, the coated strip is positioned in a chase between two light-opaque master patterns; one master pattern 35 for the coating 31 on the one major surface of the sheet 23; and the other master pattern 37 for the other coating 33 on the other major surface of the sheet 23, as shown in FIG. 3. The light-opaque patterns physically contact the coatings 31 and 33. The one master pattern 35 has a circular shape about 5 mils in outside diameter. The other master pattern 37 has a circular shape about 16 mils in diameter. Center lines of the one and the other master patterns are coincident, but may be offset from one another if desired.

With the patterns 35 and 37 positioned as shown in FIG. 3, the coatings 31 and 33 on each of the surfaces of the sheet 23 are now exposed to hardening radiation, as from a carbon-arc source, or xenon radiation lamp, which radiation passes through the glass plates 39 and 41 incident on the coatings 31 and 33 except where the one and the other master patterns 35 and 37 shadow the coatings. When the coatings are suitably exposed, the exposure is stopped, and the master patterns are removed.

Figure 4:
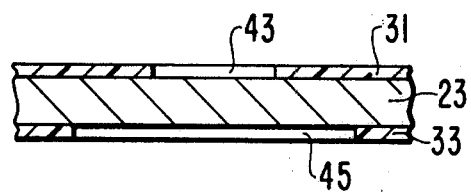

The coatings 31 and 33 are now developed as by flushing with water or other solvent to remove the unexposed, more-soluble, shadowed portions of the coatings 31 and 33. As shown in FIG. 4, after development, the sheet 23 carries on its one major surface a stencil comprising a coating 31 having a first circular opening 43 therein and, on its other major surface, a stencil comprising a coating 33 having a second circular opening 45 therein. The stencil coatings 31 and 33 with the openings 43 and 45 therein are now baked in air at about 200° C. to 240° C. to develop better etch-resistance in the coatings.

Figure 5:
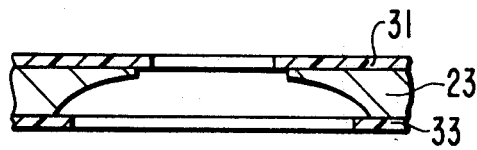

The sheet 23 with the etch-resistant stencils thereon is now selectively etched from both sides thereof in a single step or in successive steps to produce the desired aperture. FIG. 5 shows the stencil-coated sheet 23 at the end of etching. The etching is conducted in the usual manner employing a ferric-chloride hydrochloric-acid liquid etchant. Controlled amounts of chlorine gas are fed into the etchant to maintain its etching strength.

After the etching has been completed, the coated sheet 23 is washed with water to remove any residual etchant. Then, the etch-resistant stencils 31 and 33 are removed from the sheet 23, as by spraying thereon an aqueous solution of sodium hydroxide maintained at temperatures of about 50° C. to 80° C. After removing the stencils, the sheet 23 is washed in water and dried.

In a comparative study, the liquid coating compositions shown in the TABLE were used to compare the novel method (Group B) with methods (Group A) that use different PVAs and therefore require additional steps and/or expense in order to be practical. The PVAs used in compositions 1 through 5 are marketed under the trade name VINOL by Air Products & Chemicals, Inc., Allentown Pa. The PVA used in composition 6 is marketed under the trade name GELVATOL by Monsanto Plastic & Resin Co., Indian Orchard, Mass.

To prepare the coating compositions, the deionized water is heated to about 50° C. to 60° C., then the PVA is added in a steady stream with vigorous agitation of the solution. After all of the PVA has been added and dissolved, the solution is cooled to room temperature and then the viscosity is measured. Just before usage, the sodium dichromate is added, which lowers the pH of the solution to about the indicated pH.

In the coating composition used in the novel method, several factors are important:

1. Any PVA that is 85% to 97% hydrolyzed and has a molecular weight of about 75,000 to 100,000 may be used. These are synthetic polymeric materials that are available under various trade names. A stencil made of a PVA with a higher percent hydrolysis requires a higher baking temperature prior to etching and requires in addition a carmelizing baking after the etching step to aid in the removal of the stencil. Higher molecular weights do not compensate for the disadvantages that result from the higher percent hydrolysis as shown by compositions 1, 2 and 3 of Test Group A. However, it has been noticed that the desired advantages can be realized if the PVA used has a molecular weight in the specified range. The PVAs used in the novel method are less hydrolyzed and have higher molecular weight than the PVAs disclosed in the Zampiello patent, op. cit.

2. Among sodium, potassium and ammonium dichromate photosensitizers, sodium dichromate is the preferred alkali dichromate because it imparts the greater sensitivity to the coatings. The photosensitizer comprises about 0.03 (3%) to 0.15 (15%) of the weight of the PVA present, and determines the pH of the coating composition. Less than 3% dichromate requires too long an exposure to be practical. More than 15% dichromate results in poor adhesion of the photoexposed portions of the stencil. The photoexposure times of the coatings are equivalent to those used for dichromate-sensitized casein coatings.

3. No surfactant is used in the coating compositions because its presence reduces the adherence of the photoexposed coatings of the baked stencils.

4. No borax or other alkalizing material is used in the coating compositions because it gels the composition and generally makes it more difficult to coat the composition.

5. Coating thicknesses on the metal sheet are important parameters in mask manufacturing. If the coating is too thin, under 40 microinches, the etching will be nonuniform and cause mask defects. If the coating is too thick, over 200 microinches, the coating will require longer exposure times and there may be mechanical problems, pumpdown problems and poor mask uniformity.

6. The preferred bake-in temperature for imparting etch resistance to a developed PVA coating is in the range of 200° C. to 240° C. PVA coatings baked at these lower temperatures are most efficiently removed by caustic wash after etching. Generally, the higher the temperature of the etchant used, the higher should be the baking temperature for the developed coating. The lower bake-in temperatures used in the novel method can result in savings in energy and cost as compared with prior methods which require higher bake-in temperatures.

7. After etching, the hardened stencils may be removed from the metal sheet with hot (50° C. to 80° C.) dilute (1.0 molar) sodium hydroxide solution. A light brushing permits the removal of the stencil in about 1 to 5 minutes. Without brushing, but using a spray of the solution, 3 to 10 minutes may be required to remove the stencils. Any alkali solution may be used, and the selection of temperature, concentration and time of application may be optimized by a relatively few trials by persons of ordinary skill in the art. The novel method does not require the step of carmelizing the stencils prior to applying the alkali solution, resulting in a savings in energy and cost as compared to the method disclosed in Zampiello, op. cit. which requires carmelizing. In fact, after the etching step, baking of the stencils is limited to temperatures of less than 200° C. in the novel method.

TABLE

| Composition No. | Test Group A | | | Test Group B | | |
|---|---|---|---|---|---|---|
| | 1 | 2 | 3 | 4 | 5 | 6 |
| PVA - Vendor No. | V125 | V165 | V350 | V425 | V523 | 20/60 |
| % Hydrolyzed | 99.6 | 99.6 | 98.4 | 95.5 | 88.0 | 86.5 |
| Molecular Wt. | 78,000 | 125,000 | 125,000 | 78,000 | 78,000 | 96,000 |
| Viscosity | 28–32 | 55–65 | 55–65 | 26–30 | 21–25 | 21–25 |
| Wt. % Solids | 4.0 | 4.0 | 4.0 | 4.0 | 4.0 | 4.0 |
| Sodium Dichromate Wt. % Solids | 0.4 | 0.4 | 0.4 | 0.4 | 0.4 | 0.4 |
| Deionized Water Wt. % | 95.6 | 95.6 | 95.6 | 95.6 | 95.6 | 95.6 |
| pH of Composition | <6.0 | <6.0 | <6.0 | <6.0 | <6.0 | <6.0 |

What is claimed is:

1. In a method of etching a metal body including producing a stencil of a light-hardened poly(vinyl alcohol-acetate) on a surface of said body, baking said stencil to improve the resistance thereof to liquid etchant, etching said surface through said stencil with said etchant, baking said stencil after said etching and then removing said stencil from said surface, the improvement comprising constituting said stencil by light-hardening selected portions of a film consisting essentially of a dichromate-sensitized poly(vinyl alcohol-acetate) that is about 85% to 97% hydrolyzed and has a molecular weight of about 75,000 to 100,000, and then selectively removing the substantially nonhardened portions of said film.

2. The method defined in claim 1 wherein said film contains about 3 to 15 weight percent of alkali dichromate.

3. The method defined in claim 1 wherein said stencil is baked at about 200° C. to 240° C. prior to said etching step.

4. The method defined in claim 1 wherein the baking of said stencil, after said etching step, is limited to temperatures of less than 200° C.

5. The method defined in claim 1 wherein during the step of removing said stencil, said stencil is contacted with a dilute aqueous solution of alkali for about 1 to 10 minutes.

6. In a method of etching selected areas of a surface of a metal body including producing an etch-resistant stencil of light-hardened PVA on said surface, baking said stencil to improve the resistance of said stencil to attack by liquid acid, etching said surface by contacting said baked stencil and said surface with said liquid acid until said selective etching is achieved, baking said stencil after said etching and then removing said stencil from said surface, the improvement comprising producing said stencil by light hardening selected portions of a film consisting essentially of dichromate-sensitized PVA that is about 85% to 97% hydrolyzed and has a molecular weight of about 75,000 to 100,000 and then removing the nonselected film portions while retaining said selected film portions in place, and wherein the baking of said stencil after said selective etching is limited to temperatures of less than 200° C.

7. The method defined in claim 6 wherein said body is a metal strip or plate having two opposed major surfaces and dimensionally-related stencils are produced on both major surfaces.

8. The method defined in claim 6 wherein said stencil is prepared by selectively light hardening and developing a coating consisting essentially of PVA and sodium dichromate present in weight ratio range of 85/15 to 95/5 respectively.

9. The method defined in claim 6 wherein, prior to said etching step, said stencil is baked at about 200° C. for about 5 minutes to improve the resistance thereof to attack by aqueous inorganic acid.

10. The method defined in claim 6 wherein, after said etching step, the temperature of said stencil is maintained below 200° C., and said stencil is contacted with a dilute aqueous alkali hydroxide solution having a temperature of about 75° C. to 85° C.

* * * * *